United States Patent
Yoshida

(10) Patent No.: US 11,616,521 B2
(45) Date of Patent: *Mar. 28, 2023

(54) RADIO-FREQUENCY MODULE AND COMMUNICATION DEVICE

(71) Applicant: Murata Manufacturing Co., Ltd., Nagaokakyo (JP)

(72) Inventor: Daisuke Yoshida, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/878,058

(22) Filed: Aug. 1, 2022

(65) Prior Publication Data

US 2022/0376726 A1  Nov. 24, 2022

Related U.S. Application Data

(63) Continuation of application No. 17/337,459, filed on Jun. 3, 2021, now Pat. No. 11,431,371.

(30) Foreign Application Priority Data

Jun. 30, 2020 (JP) .............................. JP2020-113420

(51) Int. Cl.
*H04B 1/16* (2006.01)
*H04B 1/40* (2015.01)
(Continued)

(52) U.S. Cl.
CPC ........... *H04B 1/1615* (2013.01); *H04B 1/006* (2013.01); *H04B 1/44* (2013.01); *H04B 2001/0408* (2013.01)

(58) Field of Classification Search
CPC .... H04B 1/0053; H04B 1/006; H04B 1/0067; H04B 1/06; H04B 1/086; H04B 1/16;
(Continued)

(56) References Cited

U.S. PATENT DOCUMENTS 6,882,228 B2 * 4/2005 Rofougaran .............. H03F 3/19
330/301
7,023,272 B2  4/2006 Hung et al.
(Continued)

FOREIGN PATENT DOCUMENTS

| JP | 10-126174 A | 5/1998 |
|---|---|---|
| JP | 2003-283263 A | 10/2003 |
| JP | 4998460 B2 | 8/2012 |

*Primary Examiner* — Quochien B Vuong
(74) *Attorney, Agent, or Firm* — Xsensus LLP

(57) ABSTRACT

A radio-frequency module includes an integrated circuit (IC) device and an external inductor provided outside the IC device. The IC device includes a plurality of low-noise amplifiers, one or more inductors, and a switching circuit. The plurality of low-noise amplifiers includes a plurality of transistors in one to one correspondence. The one or more inductors are coupled to one or more of the plurality of transistors. Each inductor is coupled to the emitter or source of a corresponding one of the plurality of transistors. The switching circuit is coupled between the emitter or source of each of the plurality of transistors and the external inductor. The external inductor is coupled between the switching circuit and ground in series with each of the one or more inductors via the switching circuit.

20 Claims, 4 Drawing Sheets

(51) Int. Cl.
*H03F 3/195* (2006.01)
*H04B 1/44* (2006.01)
*H04B 1/00* (2006.01)
*H04B 1/04* (2006.01)

(58) Field of Classification Search
CPC .................. H04B 1/1615; H04B 1/44; H04B 2001/0408; H03F 3/189; H03F 3/19; H03F 3/193; H03F 3/195
See application file for complete search history.

(56) References Cited

U.S. PATENT DOCUMENTS

| | | |
|---|---|---|
| 7,348,842 B2 | 3/2008 | Ichitsubo et al. |
| 7,391,596 B2 | 6/2008 | Khorram |
| 8,036,148 B2 | 10/2011 | Fukamachi et al. |
| 8,045,940 B2 | 10/2011 | Gohn et al. |
| 8,514,021 B2 * | 8/2013 | Heikkinen .............. H03F 3/195 330/307 |
| 9,160,598 B2 * | 10/2015 | Davierwalla ........... H03F 3/193 |
| 10,560,131 B2 | 2/2020 | Horita |

* cited by examiner

RADIO-FREQUENCY MODULE AND COMMUNICATION DEVICE

CROSS-REFERENCE TO RELATED APPLICATIONS

The present application is a continuation of U.S. application Ser. No. 17/337,459, filed Jun. 3, 2021, which claims priority to Japanese patent application JP 2020-113420, filed Jun. 30, 2020, the entire contents of each are incorporated herein by reference.

BACKGROUND

1. Field

The present disclosure relates to a radio-frequency module and a communication device.

2. Description of the Related Art

Japanese Unexamined Patent Application Publication No. 10-126174 (Patent Document 1) discloses an Integrated circuit operable as a low-noise amplifier that is formed by integrating an amplifier transistor and an inductor coupled to the source or emitter of the amplifier transistor. The inductor in the integrated circuit disclosed in Patent Document 1 is formed by using a metal wire.

SUMMARY

When an inductor is formed by using a metal wire in an integrated circuit as the known technology described above, the size of the integrated circuit increases because a space larger than a given size is needed. When multiple low-noise amplifiers are integrated together, in addition to spaces for amplifier transistors, spaces for inductors are also needed, and as a result, the size of the integrated circuit further increases. Moreover, since the inductor coupled to the source or emitter of the amplifier transistor largely affects characteristics of the low-noise amplifier, there is a need for a low-loss inductor.

Accordingly, the present disclosure provides a small radio-frequency module and a small communication device that include a plurality of low-noise amplifiers with improved characteristics.

A radio-frequency module according to an aspect of the present disclosure includes an integrated circuit (IC) device and an external inductor provided outside the IC device. The IC device includes a plurality of low-noise amplifiers including a plurality of amplifier transistors in one to one correspondence, one or more inductors coupled to one or more of the plurality of amplifier transistors, each inductor being coupled to the emitter or source of a corresponding one of the plurality of amplifier transistors, and a switching circuit coupled between the emitter or source of each of the plurality of amplifier transistors and the external inductor, and the external inductor is coupled between the switching circuit and ground in series with each of the one or more inductors via the switching circuit.

A communication device according to an aspect of the present disclosure includes a signal processing circuit configured to process a radio-frequency signal and the radio-frequency module described above that is configured to communicate the radio-frequency signal between the signal processing circuit and an antenna.

The present disclosure can provide a small radio-frequency module and a small communication device that include a plurality of low-noise amplifiers with improved characteristics.

Other features, elements, characteristics, and advantages of the present disclosure will become more apparent from the following detailed description of preferred embodiments of the present disclosure with reference to the attached drawings.

DESCRIPTION OF THE PREFERRED EMBODIMENTS

Figure 1:
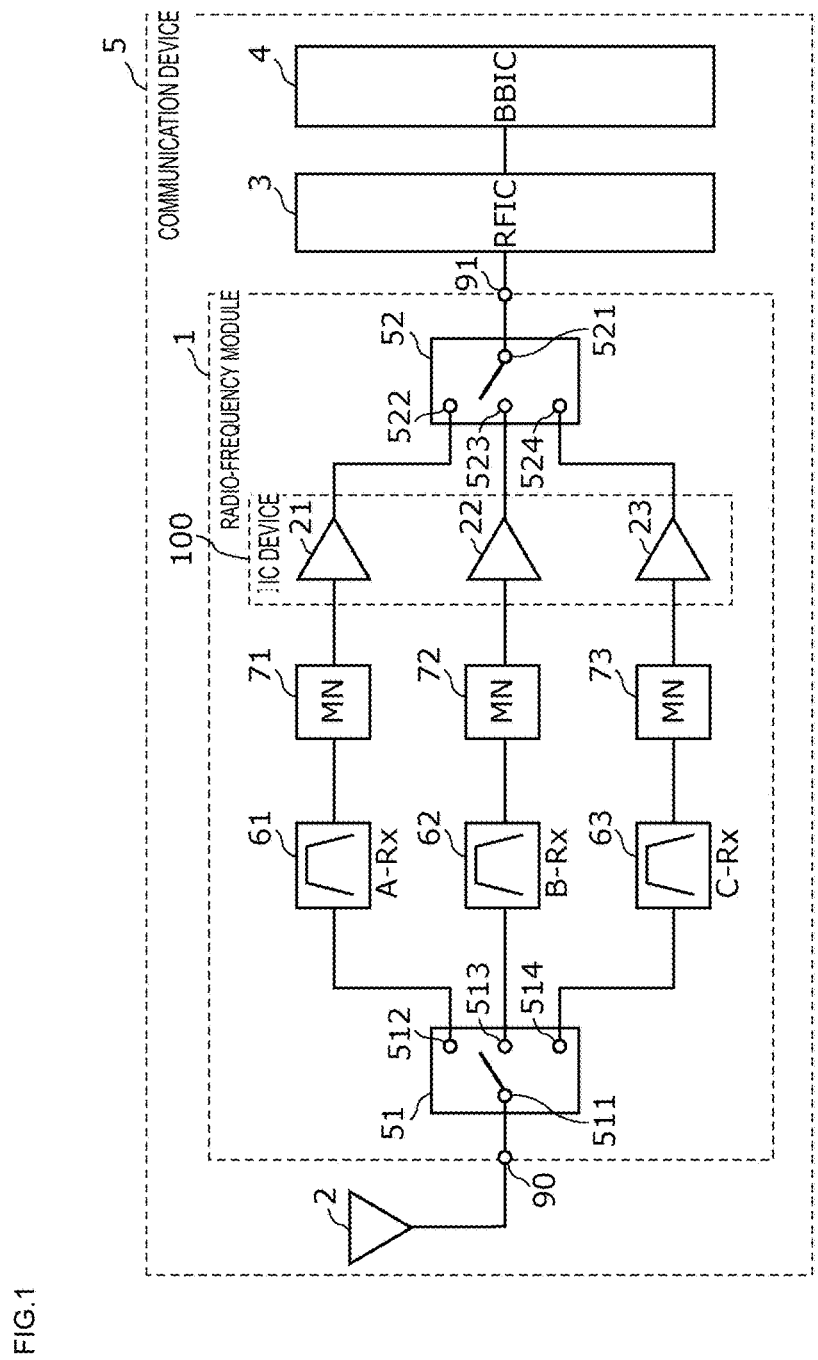
FIG. 1 is a circuit configuration diagram of a radio-frequency module and a communication device according to an embodiment.

Hereinafter, a radio-frequency module and a communication device according to a preferred embodiment of the present disclosure will be described in detail with reference to the drawings. It should be noted that the embodiment described below is one specific example of the present disclosure. Consequently, for example, numerical values, shapes, materials, constituent elements, arrangements of the constituent elements, connection modes of the constituent elements, steps, and the order of the steps given in the following embodiment are mere examples and are not intended to limit the present disclosure. Among the constituent elements in the following embodiment, constituent elements not recited in any of the independent claims are described as arbitrary constituent elements.

The drawings are schematic drawings and are not always depicted in an exact manner. Thus, for example, the drawings are not consistent in terms of scale. Like reference symbols are used to denote substantially like configurations in the drawings, and redundant descriptions thereof are omitted or simplified.

In the circuit configuration of the present disclosure, the expression "directly coupled" denotes that a circuit, element is directly coupled to another circuit element by using a connection terminal and/or a wiring conductor without intermediate connection with still another circuit element. By contrast, the expression "coupled" includes not only the case in which a circuit element is directly coupled to another circuit element by using a connection terminal and/or a wiring conductor but also the case in which a circuit element is electrically coupled to another circuit element via still another circuit element. The expression "coupled between A and B" denotes that a circuit element is coupling to both A and B while the circuit element is positioned between A and B.

With regard to the component arrangement of the present disclosure, the expression "when a substrate is viewed in plan view" denotes that objects orthogonally projected on a major surface of the substrate are viewed in a direction perpendicular to the major surface of the substrate. Additionally, the expression "A coincides with B when a substrate is viewed in plan view" denotes that at least a part of the region of A orthogonally projected on a major surface coincides with at least a part of the region of B orthogonally projected on the major surface.

Furthermore, the expression "a component is disposed at a substrate" includes the case in which the component is positioned in contact with the substrate, the case in which the component is positioned over the substrate without contact with the substrate (for example, the component is stacked on a component disposed on the substrate), and the case in which the component is partially or entirely embedded in the substrate. The expression "a component is disposed at a major surface of a substrate" includes the case in which the component is positioned in contact with the major surface of the substrate, the case in which the component is positioned over the major surface without contact with the major surface, and the case in which the component is partially embedded in the substrate at the major surface.

In this specification, words used to express relationships between elements, such as parallel and vertical, and numerical ranges do not necessarily denote the exact meanings but denote substantially the same meanings involving, for example, several percent differences.

Embodiment

1. Circuit Configuration of Radio-Frequency Module and Communication Device

Hereinafter, a circuit configuration of a radio-frequency module 1 and a communication device 5 according to the present embodiment will be described with reference to FIG. 1. FIG. 1 is a circuit configuration diagram of the radio-frequency module 1 and the communication device 5 according to the present embodiment.

1-1. Circuit Configuration of Communication Device

Firstly, a circuit configuration of the communication device 5 will be described. As illustrated in FIG. 1, the communication device 5 according to the present embodiment includes the radio-frequency module 1, an antenna 2, a radio-frequency integrated circuit (RFIC) 3, and a baseband integrated circuit (BBIC) 4. Hereinafter, the constituent elements of the communication device 5 will be described in order.

The radio-frequency module 1 communicates a radio-frequency signal between the antenna 2 and the RFIC 3. The circuit configuration of the radio-frequency module 1 will be described later. The term "circuit", is used herein to be synonymous with "circuitry" (i.e., one or more circuits). Thus, when referencing RFIC 3, is should be understood that RFIC 3 is circuitry that may include one or more separate circuits.

The antenna 2 is coupled to the antenna connection terminal 90 of the radio-frequency module 1. The antenna 2 receives a radio-frequency signal from outside and outputs the radio-frequency signal to the radio-frequency module 1.

The RFIC 3 is an example of a signal processing circuit for processing a radio-frequency signal. Specifically, the RFIC 3 processes a high-frequency receive signal inputted through a receive path of the radio-frequency module 1 by performing, for example, downconversion and outputs the processed receive signal generated by the signal processing to the BBIC 4. In this context the term "high-frequency" is meant to refer to a signal between baseband and the RF channel frequency, and not necessarily the 3 MHz to 30 MHz "HF band". The RFIC 3 includes a controller for controlling, for example, a switch and a low-noise amplifier of the radio-frequency module 1. The function of the controller of the RFIC 3 may be partially or entirely implemented outside the RFIC 3; for example, the function of the controller may be partially or entirely implemented in the BBIC 4 or the radio-frequency module 1.

The BBIC 4 is a baseband signal processing circuit configured to perform signal processing by using an intermediate frequency band lower than radio-frequency signals communicated by the radio-frequency module 1. The BBIC 4 processes, for example, image signals used to display images and/or sound signals used for calls via a speaker.

In the communication device 5 according to the present embodiment, the antenna 2 and the BBIC 4 are non-essential constituent elements.

1-2. Circuit Configuration of Radio-Frequency Module

Next, a circuit configuration of the radio-frequency module 1 will be described. As illustrated in FIG. 1, the radio-frequency module 1 includes low-noise amplifiers 21, 22, and 23, switching circuits 51 and 52, filters 61, 62, and 63, matching networks (MNs) 71, 72, and 73, the antenna connection terminal 90, and a radio-frequency output terminal 91. The radio-frequency module 1 includes an integrated circuit (IC) device 100. The IC device 100 includes the plurality of low-noise amplifiers 21, 22, and 23. Additionally, the radio-frequency module 1 includes an inductor L (refer to FIG. 2) electrically coupled to the IC device 100. The inductor L is not illustrated in FIG. 1.

The antenna connection terminal 90 is an example of an external connection terminal. The antenna connection terminal 90 is coupled to the antenna 2.

The radio-frequency output terminal 91 is an example of an external connection terminal. The radio-frequency output terminal 91 is configured to provide a radio-frequency signal outside the radio-frequency module 1. The radio-frequency output terminal 91 is coupled to the RFIC 3.

Each of the low-noise amplifiers 21, 22, and 23 is one of a plurality of low-noise amplifiers included in the IC device 100. The low-noise amplifiers 21, 22, and 23 respectively amplify radio-frequency signals in communication bands A, B, and C. Radio-frequency signals in the communication bands are amplified by the corresponding low-noise amplifiers 21, 22, and 23 and outputted from the radio-frequency output terminal 91 via the switching circuit 52.

The communication bands A, B, and C are frequency bands determined by standards organizations for communication systems developed by employing radio access technologies (RATs). The standards organizations include, for example, the 3rd Generation Partnership Project (3GPP) and the Institute of Electrical and Electronics Engineers (IEEE).

The communication bands A, B, and C are different from each other and used for an identical communication system or communication systems different from each other. For example, the communication bands A, B, and C are, but not limited to, a 5th Generation New Radio (5GNR) band, a Long Term Evolution (LTE) band, and a Wireless Local Area Network (WLAN) band.

A specific configuration of the low-noise amplifiers 21, 22, and 23 will be described later with reference to FIG. 2.

Returning to FIG. 1, the filter 61 is coupled between the antenna connection terminal 90 and the low-noise amplifier 21. The filter 61 passes signals in the receive frequency range of a communication band A out of radio-frequency receive signals inputted from the antenna connection terminal 90.

The filter 62 is coupled between the antenna connection terminal 90 and the low-noise amplifier 22. The filter 62 passes signals in the receive frequency range of the communication band B out of radio-frequency receive signals inputted from the antenna connection terminal 90.

The filter 63 is coupled between the antenna connection terminal 90 and the low-noise amplifier 23. The filter 63 passes signals in the receive frequency range of the communication band C out of radio-frequency receive signals inputted from the antenna connection terminal 90.

The matching network 71 is an input matching network for the low-noise amplifier 21. The matching network 71 is coupled to an input terminal of the low-noise amplifier 21. The matching network 71 is positioned between the filter 61 and the low-noise amplifier 21 and directly coupled to the filter 61 and the low-noise amplifier 21. The matching network 71 performs impedance matching between the filter 61 and the low-noise amplifier 21.

The matching network 72 is an input matching network for the low-noise amplifier 22. The matching network 72 is coupled to an input terminal of the low-noise amplifier 22. The matching network 72 is positioned between the filter 62 and the low-noise amplifier 22 and directly coupled to the filter 62 and the low-noise amplifier 22. The matching network 72 performs impedance matching between the filter 62 and the low-noise amplifier 22.

The matching network 73 is an input matching network for the low-noise amplifier 23. The matching network 73 is coupled to an input terminal of the low-noise amplifier 23. The matching network 73 is positioned between the filter 63 and the low-noise amplifier 23 and directly coupled to the filter 63 and the low-noise amplifier 23. The matching network 73 performs impedance matching between the filter 63 and the low-noise amplifier 23.

The switching circuit 51 is coupled between the antenna connection terminal 90 and the filters 61, 62, and 63. Specifically, the switching circuit 51 includes terminals 511, 512, 513, and 514. The terminal 511 is a common terminal. The terminal 511 is coupled to the antenna connection terminal 90. The terminals 512, 513, and 514 are selection terminals. The terminals 512, 513, and 514 are respectively coupled to the filters 61, 62, and 63. In accordance with, for example, a control signal from the RFIC 3, the switching circuit 51 can connect a corresponding one of the terminals 512, 513, and 514 to the terminal 511. This means that the switching circuit 51 can control connection between the antenna 2 and the filter 61, connection between the antenna 2 and the filter 62, and connection between the antenna 2 and the filter 63. The switching circuit 51 is implemented as, for example, a single-pole triple-throw (SP3T) switching circuit. The switching circuit 51 is referred to as an antenna switch.

The switching circuit 52 is coupled between the radio-frequency output terminal 91 and the low-noise amplifiers 21, 22, and 23. Specifically, the switching circuit 52 includes terminals 521, 522, 523, and 524. The terminal 521 is a common terminal. The terminal 521 is coupled to the radio-frequency output terminal 91. The terminals 522, 523, and 524 are selection terminals. The terminals 522, 523, and 524 are respectively coupled to an output terminal of the low-noise amplifier 21, an output terminal of the low-noise amplifier 22, and an output terminal of the low-noise amplifiers 23. In accordance with, for example, a control signal from the RFIC 3, the switching circuit 52 can connect a corresponding one of the terminals 522, 523, and 524 to the terminal 521. This means that the switching circuit 52 can control connection between the RFIC 3 and the low-noise amplifier 21, connection between the RFIC 3 and the low-noise amplifier 22, and connection between the RFIC 3 and the low-noise amplifier 23. The switching circuit 52 is implemented as, for example, an SP3T switching circuit. The switching circuit 52 is referred to as a band selection switch.

One or some of the circuit elements illustrated in FIG. 1 may be excluded from the radio-frequency module 1. For example, the radio-frequency module 1 only needs to include at least the IC device 100 without the other circuit elements.

1-3. Circuit Configuration of IC Device

Next, a circuit configuration of the IC device 100 will be described with reference to FIG. 2. FIG. 2 is a circuit configuration diagram of the IC device 100 according to the present embodiment.

Figure 2:
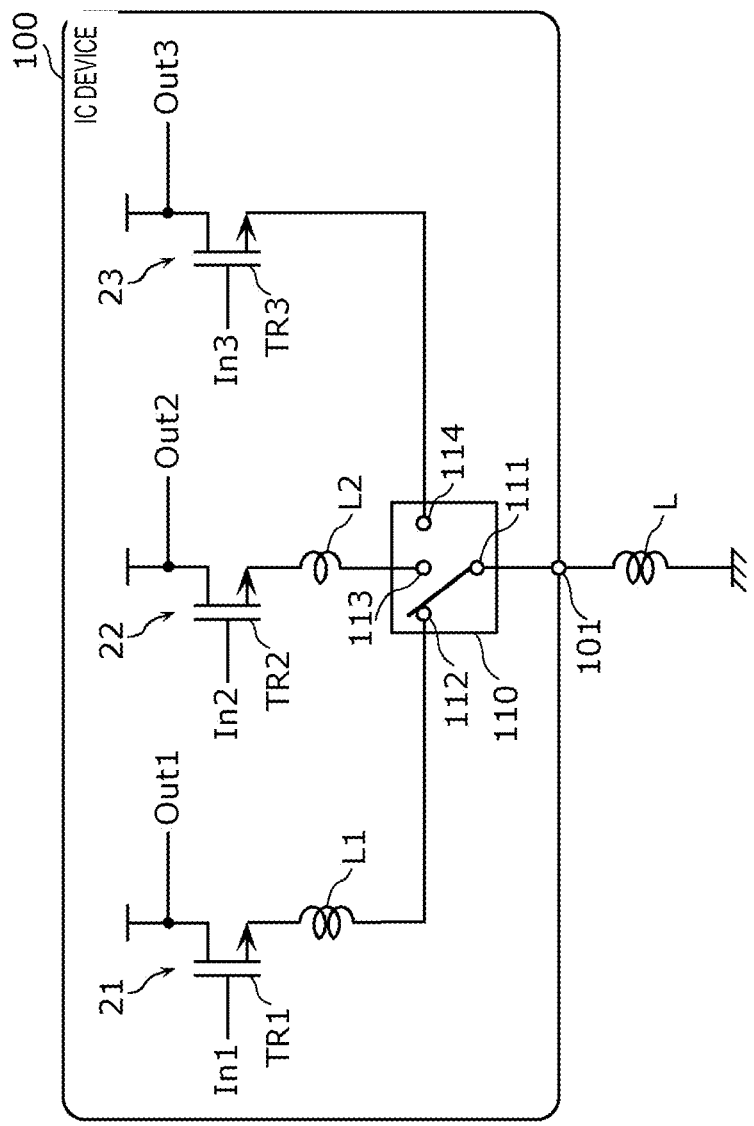
FIG. 2 is a circuit configuration diagram of an integrated circuit (IC) device of the radio-frequency module according to the embodiment.

As illustrated in FIG. 2, the IC device 100 includes the low-noise amplifiers 21, 22, and 23, inductors L1 and L2, and a switching circuit 110. The IC device 100 also includes a connection terminal 101. The connection terminal 101 is an external connection terminal of the IC device 100. The connection terminal 101 is grounded via the inductor L.

The low-noise amplifier 21 includes a transistor TR1. The transistor TR1 is an amplifier transistor configured to amplify a radio-frequency signal (specifically, a radio-frequency signal in the communication band A) inputted to an input terminal In1 and output the signal from an output terminal Out1.

The transistor TR1 is, for example, a field effect transistor (FET). The gate of the transistor TR1 is coupled to the input terminal In1 of the low-noise amplifier 21. The drain of the transistor TR1 is coupled to the output terminal Out1 of the low-noise amplifier 21. The source of the transistor TR1 is coupled to the inductor L1.

The low-noise amplifier 22 includes a transistor TR2. The transistor TR2 is an amplifier transistor configured to amplify a radio-frequency signal (specifically, a radio-frequency signal in the communication band B) inputted to an input terminal In2 and output the signal from an output terminal Out2.

The transistor TR2 is, for example, a FET. The gate of the transistor TR2 is coupled to the input terminal In2 of the low-noise amplifier 22. The drain of the transistor TR2 is coupled to the output terminal Out2 of the low-noise amplifier 22. The source of the transistor TR2 is coupled to the inductor L2.

The low-noise amplifier 23 includes a transistor TR3. The transistor TR3 is an amplifier transistor configured to amplify a radio-frequency signal (specifically, a radio-frequency signal in the communication band C) inputted to an input terminal In3 and output the signal from an output terminal Out3.

The transistor TR3 is, for example, a FET. The gate of the transistor TR3 is coupled to the input terminal In3 of the low-noise amplifier 23. The drain of the transistor TR3 is coupled to the output terminal Out3 of the low-noise amplifier 23. The source of the transistor TR3 is coupled to the switching circuit 110.

The switching circuit 110 is coupled between the source of the transistor TR1, the source of the transistor TR2, and the source of the transistor TR3, and the connection terminal 101. The switching circuit 110 includes terminals 111, 112, 113, and 114. The terminal 111 is a common terminal. The terminal 111 is coupled to the connection terminal 101. The terminals 112, 113, and 114 are selection terminals. The terminals 112, 113, and 114 are respectively coupled to the source of the transistor TR1, the source of the transistor TR2, and the source of the transistor TR3. Specifically, the terminal 112 is coupled to the source of the transistor TR1 via the inductor L1. The terminal 113 is coupled to the source of the transistor TR2 via the inductor L2. The terminal 114 is directly coupled to the source of the transistor TR3.

The switching circuit 110 controls connection between the source of the transistor TR1 and the inductor L, connection between the source of the transistor TR2 and the inductor L, and connection between the source of the transistor TR3 and the inductor L. Specifically, in accordance with, for example, a control signal from the RFIC 3, the switching circuit 110 can connect a corresponding one of the terminals 112, 113, and 114 to the terminal 111. This means that the switching circuit 110 can control connection between the source of the transistor TR1 and the inductor L, connection between the source of the transistor TR2 and the inductor L, and connection between the source of the transistor TR3 and the inductor L. The switching circuit 110 is implemented as, for example, an SP3T switching circuit.

The switching circuit 110 is controlled in conjunction with the switching circuits 51 and 52. For example, when the antenna 2 receives a radio-frequency signal in the communication band A, the terminal 511 is coupled to the terminal 512 in the switching circuit 51; the terminal 521 is coupled to the terminal 522 in the switching circuit 52; and the terminal 111 is coupled to the terminal 112 in the switching circuit 110. In this manner, the radio-frequency signal in the communication band A can be amplified by the low-noise amplifier 21.

In the present embodiment, the source of the transistor TR1, the source of the transistor TR2, and the source of the transistor TR3 are all configured to be grounded via the switching circuit 110. For example, the terminal 111 is coupled to the terminal 112 in the switching circuit 110, and as a result, the source of the transistor TR1 is grounded via the inductors L1 and L. The terminal 111 is coupled to the terminal 113 in the switching circuit 110, and as a result, the source of the transistor TR2 is grounded via the inductors L2 and L. The terminal 111 is coupled to the terminal 114 in the switching circuit 110, and as a result, the source of the transistor TR3 is grounded via the inductor L.

The inductors L, L1, and L2 each function as a part or all of the source inductor of a corresponding one of the transistors TR1, TR2 and TR3 included in the IC device 100. The inductors L1 and L2 are provided in the IC device 100. The inductor L is an example of an external inductor provided outside the IC device 100. The inductor L is coupled between the connection terminal 101 and the ground. The inductor L is coupled in series with each of the inductors L1 and L2 via the switching circuit 110.

The source inductor is coupled between the source of an amplifier transistor grounded via the source and the ground. The source inductor controls the impedance between the source of an amplifier transistor and the ground. The impedance is controlled to be an appropriate value, and thus, the amplifier transistor can appropriately amplify an input radio-frequency signal.

The inductance of the source inductor can be determined in accordance with the frequency of the radio-frequency signal inputted to the amplifier transistor. Specifically, when the frequency of the radio-frequency signal inputted to the amplifier transistor is relatively low, the inductance of the source inductor is increased.

In the present embodiment, the transistors TR1, TR2 and TR3 differ from each other in terms of the frequency of the radio-frequency signal inputted to each transistor. Thus, the transistors TR1, TR2 and TR3 also differ from each other with respect to the inductance of the source inductor. For example, it is assumed that the frequency of a radio-frequency signal in the communication band A inputted to the transistor TR1 is the lowest and the frequency of a radio-frequency signal in the communication band C inputted to the transistor TR1 is the highest. In this case, the inductance of the source inductor of the transistor TR1 is the largest, and the inductance of the source inductor of the transistor TR3 is the smallest.

In the present embodiment, the source inductor of the transistor TR1 is constituted by the inductor L1 in the IC device 100 and the inductor L outside the IC device 100 coupled in series with each other. The source inductor of the transistor TR2 is constituted by the inductor L2 in the IC device 100 and the inductor L outside the IC device 100 coupled in series with each other. The source inductor of the transistor TR3 is constituted by only the inductor L outside the IC device 100.

As described above, the external inductor L is shared by the transistors TR1, TR2, and TR3. The inductance of the inductor L is determined to be a value suitable for the source inductor of the transistor TR3. To provide compensation for insufficient inductance of the transistors TR1 and TR2, the inductors L1 and L2 are individually provided in the IC device 100.

The Q factor of the inductor L outside the IC device 100 is usually higher than the Q factor of the inductor L1 and the Q factor of the inductor L2 provided inside the IC device 100. Using the inductor L with high Q factor and low loss enhances electrical characteristics of the low-noise amplifiers 21, 22, and 23.

For example, the inductance of the inductor L is larger than both the inductance of the inductor L1 and the inductance of the inductor L2. Since the inductance of the inductor L with high Q factor and low loss occupies as much inductance required for the source inductor as possible, electrical characteristics can be enhanced.

It should be noted that another inductor may also be coupled between the transistor TR3 and the terminal 114.

2. Component Arrangement of Radio-Frequency Module

Next, a component arrangement of the radio-frequency module 1 configured as described above will be described with reference to FIG. 3.

Figure 3:
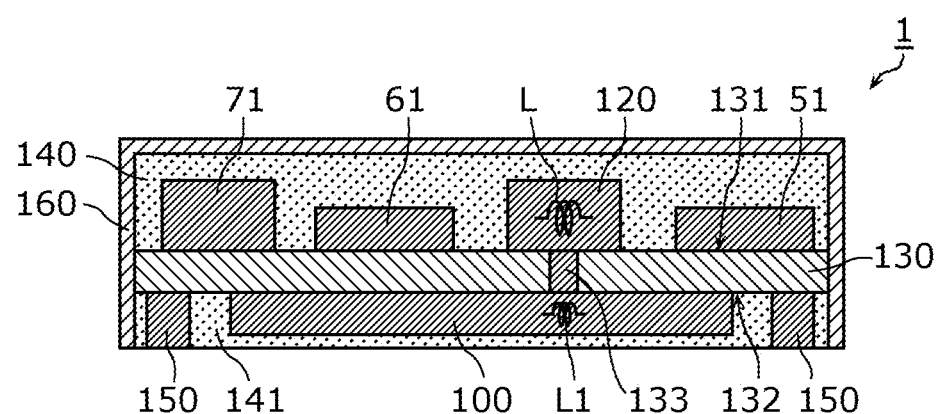
FIG. 3 is a sectional view of the radio-frequency module according to the embodiment.

FIG. 3 is a sectional view of the radio-frequency module 1 according to the present embodiment. As illustrated in FIG. 3, the radio-frequency module 1 includes, in addition to the circuit components including the circuit elements illustrated in FIG. 1, a chip inductor 120, a module substrate 130, resin members 140 and 141, a plurality of post electrodes 150, and a shield electrode layer 160.

The module substrate 130 includes major surfaces 131 and 132. The module substrate 130 may be, for example, a low temperature co-fired ceramics (LTCC) substrate having a layered structure composed of a plurality of dielectric layers, a high temperature co-fired ceramics (HTCC) substrate, a component-embedded substrate, a substrate including a redistribution layer (RDL), or a printed board, but the module substrate 130 is not limited to these examples.

The major surface 131 is an example of a first major surface. The major surface 131 may be referred to as an upper surface or front surface when appropriate. The switching circuit 51, the filter 61, the matching network 71, and the chip inductor 120 are disposed at the major surface 131. The switching circuit 52, the filters 62 and 63, and the matching networks 72 and 73 are also disposed at the major surface 131, which are not illustrated in FIG. 3.

The major surface 132 is an example of a second major surface that is opposite to the first major surface. The major surface 132 may be referred to as a lower surface or back surface when appropriate. The IC device 100 is disposed at the major surface 132. The separation of the elements between the major surfaces 131 and 132 is a mere example, and the separation of the elements should not be construed in a limiting sense.

The IC device 100 is a component (semiconductor integrated circuit) including an electronic circuit formed on and inside a semiconductor chip (also referred to as a die). The IC device 100 is constituted by, for example, a complementary metal-oxide semiconductor (CMOS). Specifically, the IC device 100 is manufactured by a silicon on insulator (SOI) process. As a result, the IC device 100 can be inexpensively manufactured. The IC device 100 may be formed from at least one of GaAs, SiGe, and GaN. As a result, the IC device 100 can be manufactured with high quality.

The chip inductor 120 is an example of a first chip component including the inductor L illustrated in FIG. 2. In the present embodiment, the chip inductor 120 coincides with the IC device 100 when viewed in plan view. For example, as illustrated in FIG. 3, the chip inductor 120 coincides with the inductor L1 in the IC device 100 when viewed in plan view. The chip inductor 120 may coincide with the inductor L2 instead of or together with the inductor L1.

The switching circuits 51 and 52 are implemented as semiconductor integrated circuits in the same manner as the IC device 100. The IC device 100 may include the switching circuits 51 and 52.

The filters 61, 62, and 63 are each implemented as, for example, a surface acoustic wave (SAW) filter, a bulk acoustic wave (BAW) filter, an LC resonance filter, or a dielectric filter, or any combination thereof, but the filters 61, 62, and 63 are not limited to these examples.

The matching networks 71, 72, and 73 are each implemented as, for example, a surface mount device (SMD) including an inductor and/or a capacitor. The surface mount device is an example of a second chip component including at least one of the matching networks 71, 72, and 73.

The filters 61, 62, and 63 and the matching networks 71, 72, and 73 may be partially or entirely formed in the module substrate 130 and may be implemented as an integrated passive device (IPD).

A via-conductor 133 is provided at the module substrate 130. The via-conductor 133 is a conductor filling a through via penetrating the module substrate 130 in a thickness direction. The via-conductor 133 electrically couples the connection terminal 101 (refer to FIG. 2) of the IC device 100 and the chip inductor 120.

The vis-conductor 133 may be constituted by a conductor filling a blind via formed at the major surface 131, a conductor filling a blind via formed at the major surface 132, and a planer electrode pattern connecting the conductors filling the two blind vias in the module substrate 130.

The resin member 140 is disposed on the major surface 131 of the module substrate 130 to cover the circuit components disposed at the major surface 131. The resin member 141 is disposed on the major surface 132 of the module substrate 130 to cover the circuit components disposed at the major surface 132. The resin members 140 and 141 make the circuit components reliable with respect to characteristics such as mechanical strength and moisture resistance.

The post electrodes 150 function as external connection terminals including the antenna connection terminal 90 and the radio-frequency output terminal 91. The post electrodes 150 are disposed at the major surface 132 of the module substrate 130 to stand perpendicularly to the major surface 132. The post electrodes 150 penetrate the resin member 141, and one end of each post electrode 150 is exposed from the resin member 141. The one end of each post electrode 150 exposed from the resin member 141 is coupled to, for example, one of input-output terminals and/or ground electrodes at a mother substrate disposed on the lower surface side with respect to the radio-frequency module 1.

The shield electrode layer 160 is a metallic thin film formed by employing, for example, a sputtering technique. The shield electrode layer 160 covers upper and side surfaces of the resin member 140, side surfaces of the module substrate 130, and side surfaces of the resin member 141. The shield electrode layer 160 is set at a ground potential, and as a result, the shield electrode layer 160 can prevent the entrance of foreign noises into the circuit components constituting the radio-frequency module 1.

3. Effects

As described above, the radio-frequency module 1 according to the present embodiment includes the IC device 100 and the inductor L provided outside the IC device 100. The IC device 100 includes the low-noise amplifiers 21, 22, and 23 each having an amplifier transistor, the inductors L1 and L2 respectively coupled to the emitter or source of the transistor TR1 and the emitter or source of the transistor TR2, and the switching circuit 110 coupled between the emitter or source of the transistor TR1, the emitter or source of the transistor TR2, and the emitter or source of the transistor TR3 and the inductor L. The inductor L is coupled between the switching circuit 110 and the ground in series with the inductors L1 and L2 via the switching circuit 110.

The low-noise amplifiers 21, 22, and 23 are integrated together in this manner, and thus, the radio-frequency module 1 can be downsized. Additionally, since the source inductor of the transistor TR1, the source inductor of the transistor TR2, and the source inductor of the transistor TR3 are partially or entirely implemented as the inductor L outside the IC device 100, spaces necessary for the inductors L1 and L2 in the IC device 100 are reduced. As a result, the radio-frequency module 1 can be downsized.

Further, the Q factor of the inductor L provided outside the IC device 100 can be increased more easily than the Q factor of the inductor L formed in the IC device 100. The increased Q factor of a part or all of the source inductor reduces losses, and consequently, it is possible to enhance electrical characteristics of the low-noise amplifiers 21, 22, and 23.

The low-noise amplifiers 21, 22, and 23 support different communication bands to each properly amplify a radio-frequency signal in a corresponding communication band. As such, it is possible to implement the small radio-frequency module 1 including the low-noise amplifiers 21, 22, and 23 supporting multiple bands while achieving improved characteristics.

If the source inductor of the transistor TR1, the source inductor of the transistor TR2, and the source inductor of the transistor TR3 are all provided outside the IC device 100, characteristics of the low-noise amplifiers 21, 22, and 23 can be improved. However, in this case, the IC device 100 needs external connection terminals for the individual low-noise amplifiers, which hinders downsizing of the IC device 100. The present embodiment can reduce external connection terminals because the IC device 100 includes the switching circuit 110, and accordingly, it is possible to achieve downsizing.

Furthermore, for example, the inductance of the inductor L is larger than both the inductance of the inductor L1 and the inductance of the inductor L2.

Hence, the inductance of the inductor L with high Q factor can occupy as much inductance required for the source inductor as possible, and thus, electrical characteristics can be enhanced.

Moreover, for example, the radio-frequency module 1 according to the present embodiment further includes the module substrate 130 having the major surface 131 and the major surface 132 opposite to the major surface 131 and also includes the chip components disposed at the major surface 131. The IC device 100 is disposed at the major surface 132. The chip inductor 120 as a chip component including the inductor L coincides with the IC device 100 when viewed in plan view.

As such, the inductor L is implemented as the chip inductor 120, and thus, it is possible to increase the Q factor of the inductor L. Further, since the components included in the radio-frequency module 1 are disposed at both surfaces of the module substrate 130, it is possible to decrease the area of the module substrate 130 in comparison to the case in which the components are disposed at only one surface, which achieves downsizing of the radio-frequency module 1. Furthermore, the chip inductor 120 and the IC device 100 coincide with each other when viewed in plan view, and this structure shortens the interconnection length between the chip inductor 120 and the IC device 100. As a result, it is possible to reduce wiring losses and mismatching losses due to variations in wirings, which enhances electrical characteristics of the radio-frequency module 1.

Moreover, for example, the chip inductor 120 coincides with the inductor L1 or L2 in the IC device 100 when the module substrate 130 is viewed in plan view.

This structure can further shorten the interconnection length between the chip inductor 120 (the inductor L) and the inductor L1 or L2. As a result, it is possible to further reduce wiring losses and mismatching losses due to variations in wirings, which further enhances electrical characteristics of the radio-frequency module 1.

Further, for example, the communication device 5 according to the present embodiment includes the RFIC 3 configured to process a radio-frequency signal and the radio-frequency module 1 configured to communicate a radio-frequency signal between the RFIC 3 and the antenna 2.

This configuration enables the communication device 5 to achieve almost the same effects as the effects of the radio-frequency module 1.

4. Modifications

Hereinafter, modifications to the embodiment described above will be described.

4-1. First Modification

Firstly, a first modification will be described. This modification differs from the embodiment mainly in the positional relationship between the IC device and the input matching networks. The following description mainly focuses on differences from the embodiment and omits or simplifies descriptions about common points.

Figure 4:
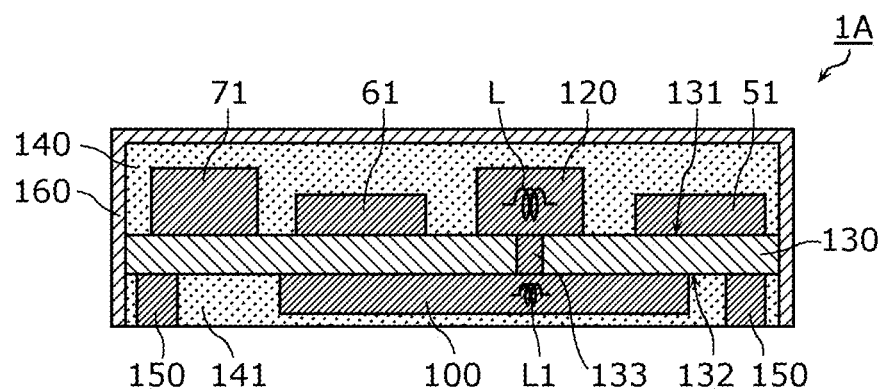
FIG. 4 is a sectional view of a radio-frequency module according to a first modification of the embodiment.

FIG. 4 is a sectional view of a radio-frequency module 1A according to this modification. As illustrated in FIG. A, the chip component including the matching network 71 does not coincide with at least one inductor in the IC device 100 when viewed in plan view. Specifically, the matching network 71 does not coincide with both the inductors L1 and L2 in the IC device 100 when viewed in plan view. In the example illustrated in FIG. 4, the matching network 71 does not coincide with the IC device 100 when viewed in plan view.

The chip components including the matching networks 72 and 73, which are not illustrated in the drawing, do not necessarily coincide with at least one inductor in the IC device 100 when viewed in plan view.

As described above, the radio-frequency module 1A according to this modification includes a chip component including one input matching network for one of the low-noise amplifiers 21, 22, and 23. The chip component does not coincide with the inductor L1 or L2 in the IC device 100 when viewed in plan view.

This structure hinders electromagnetic field coupling between the matching networks 71, 72, and 73 and the inductors L1 and L2 in the IC device 100, and thus, it is possible to enhance electrical characteristics of the radio-frequency module 1A.

4-2. Second Modification

Next, a second modification will be described. This modification differs from the embodiment mainly in that a ground electrode pattern is provided between the IC device and the input matching networks. The following description mainly focuses on differences from the embodiment and omits or simplifies descriptions about common points.

Figure 5:
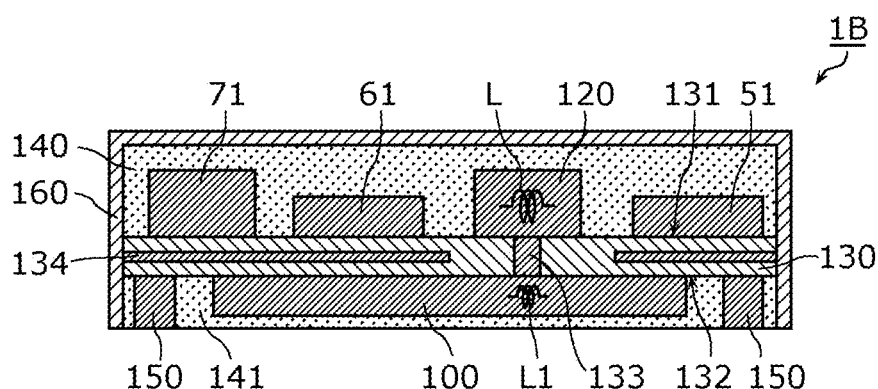
FIG. 5 is a sectional view of a radio-frequency module according to a second modification of the embodiment.

FIG. 5 is a sectional view of a radio-frequency module 1B according to this modification. As illustrated in FIG. 5, the radio-frequency module 1B includes a ground electrode pattern 134 provided at the module substrate 130. The ground electrode pattern 134 is a planer electrode pattern provided inside the module substrate 130. For example, side surfaces of the ground electrode pattern 134 are coupled to the shield electrode layer 160, and as a result, the ground electrode pattern 134 is set at the ground potential.

As described above, the radio-frequency module 1B according to this modification includes a chip component including one input matching network for one of the low-noise amplifiers 21, 22, and 23 and the ground electrode pattern 134 provided at the module substrate 130. The chip component including the one input matching network coincides with the ground electrode pattern 134 when viewed in plan view.

Because the ground electrode pattern 134 is provided, this structure hinders electromagnetic field coupling between the matching networks 71, 72, and 73 and the inductors L1 and L2 in the IC device 100. Thus, it is possible to enhance electrical characteristics of the radio-frequency module 1B.

4-3. Third Modification

Next, a third modification will be described. This modification differs from the embodiment mainly in that the inductor provided outside the IC device is provided at the module substrate. The following description mainly focuses on differences from the embodiment and omits or simplifies descriptions about common points.

Figure 6:
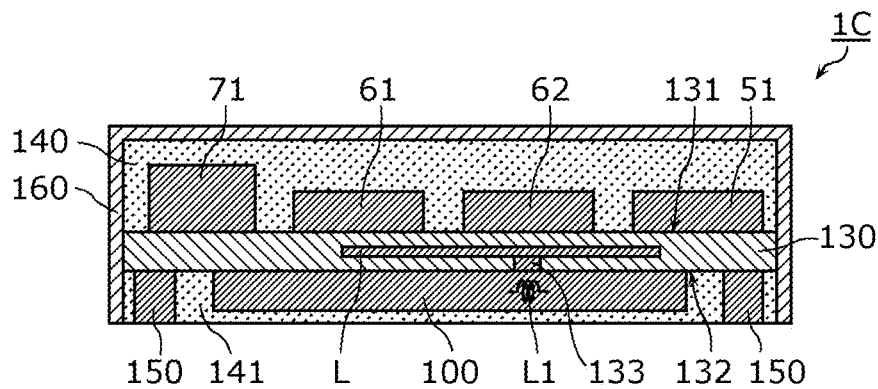
FIG. 6 is a sectional view of a radio-frequency module according to a third modification of the embodiment.

FIG. 6 is a sectional view of a radio-frequency module 1C according to this modification. As illustrated in FIG. 6, the radio-frequency module 1C includes the inductor L implemented as a planer electrode pattern instead of the chip inductor 120. The inductor L is formed of at least one of a metal wire such as a stripline or microstripline and a via-conductor.

As such, in the radio-frequency module 1C according to this modification, the inductor L provided outside the IC device 100 is implemented as a structure other than the chip inductor 120. This case also achieves almost the same effects as the effects of the radio-frequency module 1 according to the embodiment.

Others

While the radio-frequency module and the communication device according to the present disclosure has been described above by using the embodiment and its modifications, the present disclosure is not limited to the embodiment.

For example, the IC device 100 may include two, four, or more low-noise amplifiers. This means that the radio-frequency module 1 may be configured to receive and process radio-frequency signals in two, four, or more communication bands. The filters, input matching networks, and selection terminals of switches included in the radio-frequency module 1 may be, for example, identical in number to the low-noise amplifiers.

Further, for example, the inductance of the inductor L outside the IC device 100 is larger than both the inductance of the inductor L1 and the inductance of the inductor L2 in the IC device 100 in the embodiment, but this should not be construed in a limiting sense. The inductance of the external inductor L may be identical to or different from the inductance of the internal inductor L1 or the inductance of the internal inductors L2.

Furthermore, the transistors TR1, TR2 and TR3 may be, for example, bipolar transistors, in this case, the gate, drain, and source of FET in the above description are replaced with the base, collector, and emitter of bipolar transistor. At least one inductor included in the IC device 100 is coupled to the emitter of a bipolar transistor functioning as an amplifier transistor.

Moreover, for example, the electronic components including the IC device 100 are disposed at both surfaces of the module substrate 130 in the embodiment, but this should not be construed in a limiting sense. All the electronic components included in the radio-frequency module 1 may be disposed at only one surface of the module substrate 130.

Further, for example, the external connection terminals of the radio-frequency module 1 are implemented as the post electrodes 150 in the embodiment, but this should not be construed in a limiting sense. The external connection terminals may be implemented as bump electrodes.

Furthermore, for example, the communication device 5 is a receiver in the embodiment, but this should not be construed in a limiting sense. The communication device 5 may be, for example, a transceiver. In this case, the radio-frequency module 1 may include a transmit circuit including, for example, power amplifiers and transmit filters.

In addition, all forms obtained by making to the embodiment and modifications various changes that occur to those skilled in the art and all forms implemented as any combination of components and functions according to the embodiment and modifications without departing from the scope of the present disclosure are embraced within the present disclosure.

The present disclosure can be used as a radio-frequency module provided at the front-end for various communication devices such as a mobile phone.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A radio-frequency module comprising:
a module substrate;
a first inductor connected to ground at one end; and
a first integrated circuit that is mounted on the module substrate and includes
a first switch having a common terminal, a first selective terminal, and a second selective terminal, the common terminal connected to the other end of the first inductor,
a first low noise amplifier (LNA) disposed in a first circuit path that is connected to the first selective terminal of the first switch,
a second LNA disposed in a second circuit path that is connected to the second selective terminal of the first switch,
a second inductor disposed in the first circuit path and connected between the first selective terminal of the first switch and the first LNA, wherein
the first LNA has a first transistor, and the second inductor is connected to an emitter or source of the first transistor, and
the first inductor is implemented as a planar electrode pattern hosted by the module substrate.

2. The radio-frequency module of claim 1, wherein the first inductor is disposed inside the module substrate.

3. The radio-frequency module of claim 2, wherein the first inductor is oriented in parallel with a main surface of the module substrate.

4. The radio-frequency module of claim 3, wherein the first inductor comprises a metal wire.

5. The radio-frequency module of claim 4, wherein the first inductor being a stripline inductor.

6. The radio-frequency module of claim 4, wherein the first inductor being a micro-stripline inductor.

7. The radio-frequency module of claim 1, wherein the first inductor is at least partially disposed beneath an outer surface of the module substrate.

8. The radio-frequency module of claim 7, wherein the first inductor comprises a via-conductor.

9. The radio-frequency module of claim 1, wherein the ground comprising a ground electrode pattern disposed within the module substrate.

10. The radio-frequency module of claim 1, wherein:
the first integrated circuit comprising a third LNA disposed in a third circuit path that is different than the first circuit path and the second circuit path.

11. The radio-frequency module of claim 10, wherein the third LNA includes a third transistor, and
the first switch includes a third selective terminal that is connected to an emitter or source of the third transistor.

12. The radio-frequency module of claim 11, wherein the first integrated circuit further comprising a third inductor disposed in the second circuit path and connected between the second selective terminal of the first switch and an emitter or source of the second LNA.

13. The radio-frequency module of claim 12, wherein the third selective terminal is directly connected to the emitter or the source of the third transistor, without an intervening discrete inductor.

14. The radio-frequency module of claim 12, wherein an inductance of the first inductor is larger than an inductance of the second inductor and larger than an inductance of the third inductor.

15. The radio-frequency module of claim 1, wherein the module substrate includes a first major surface and a second major surface that is on an opposite side of the module substrate than the first major surface,
the first integrated circuit is disposed on the second major surface, and
from a plan view of the module substrate, a footprint of the first inductor coincides with a footprint of the first integrated circuit.

16. A communication device comprising:
a signal processing circuit configured to process a radio-frequency signal; and
a radio-frequency module configured to communicate the radio-frequency signal between the signal processing circuit and an antenna, the radio-frequency module including
a module substrate,
a first inductor connected to ground at one end, and
a first integrated circuit that is mounted on the module substrate and includes
a first switch having a common terminal, a first selective terminal, and a second selective terminal, the common terminal connected to the other end of the first inductor,
a first low noise amplifier (LNA) disposed in a first circuit path that is connected to the first selective terminal of the first switch,
a second LNA disposed in a second circuit path that is connected to the second selective terminal of the first switch,
a second inductor disposed in the first circuit path and connected between the first selective terminal of the first switch and the first LNA, wherein
the first LNA has a first transistor, and the second inductor is connected to an emitter or source of the first transistor, and
the first inductor is implemented as a planar electrode pattern hosted by the module substrate.

17. The communication device of claim 16, wherein
the first integrated circuit comprising a third LNA disposed in a third circuit path that is different than the first circuit path and the second circuit path,
the third LNA includes a third transistor, and
the first switch includes a third selective terminal that is connected to an emitter or source of the third transistor.

18. The communication device of claim 17, wherein
the first integrated circuit further comprising a third inductor disposed in the second circuit path and connected between the second selective terminal of the first switch and an emitter or source of the second LNA.

19. The communication device of claim 18, wherein
the third selective terminal is directly connected to the emitter or the source of the third transistor, without an intervening discrete inductor.

20. The communication device of claim 16, wherein
the module substrate includes a first major surface and a second major surface that is on an opposite side of the module substrate than the first major surface,
the first integrated circuit is disposed on the second major surface, and
from a plan view of the module substrate, a footprint of the first inductor coincides with a footprint of the first integrated circuit.

* * * * *